(12) United States Patent
Gross et al.

(10) Patent No.: US 10,934,178 B2
(45) Date of Patent: Mar. 2, 2021

(54) USING WASTE HEAT FROM A DATA CENTER COOLING SYSTEM TO FACILITATE LOW-TEMPERATURE DESALINATION

(71) Applicant: Oracle International Corporation, Redwood Shores, CA (US)

(72) Inventors: Kenny C. Gross, Escondido, CA (US); Sanjeev Sondur, Horsham, PA (US)

(73) Assignee: Oracle International Corporation

( * ) Notice: Subject to any disclaimer, the term of this patent is extended or adjusted under 35 U.S.C. 154(b) by 0 days.

(21) Appl. No.: 16/787,453

(22) Filed: Feb. 11, 2020

(65) Prior Publication Data

US 2020/0172411 A1    Jun. 4, 2020

Related U.S. Application Data

(62) Division of application No. 15/884,851, filed on Jan. 31, 2018, now Pat. No. 10,669,164.

(51) Int. Cl.
| | |
|---|---|
| C02F 1/16 | (2006.01) |
| H05K 7/20 | (2006.01) |
| C02F 1/04 | (2006.01) |
| C02F 1/26 | (2006.01) |
| C02F 103/08 | (2006.01) |

(52) U.S. Cl.
CPC .......... *C02F 1/16* (2013.01); *C02F 1/043* (2013.01); *C02F 1/046* (2013.01); *C02F 1/048* (2013.01); *C02F 1/265* (2013.01); *H05K 7/20763* (2013.01); *H05K 7/20836* (2013.01); *C02F 2103/08* (2013.01); *C02F 2209/40* (2013.01)

(58) Field of Classification Search
CPC .. C02F 1/04; C02F 1/043; C02F 1/046; C02F 1/048; C02F 1/16; H05K 7/20; H05K 7/20763–2079; H05K 7/20836
See application file for complete search history.

(56) References Cited

U.S. PATENT DOCUMENTS

| | | | | |
|---|---|---|---|---|
| 8,080,138 | B2* | 12/2011 | Nirmalakhandan | B01D 1/0058 203/11 |
| 2012/0005683 | A1* | 1/2012 | Bower | G06F 9/5094 718/103 |
| 2015/0144562 | A1* | 5/2015 | Constantz | C02F 1/441 210/652 |

* cited by examiner

*Primary Examiner* — Renee Robinson
(74) *Attorney, Agent, or Firm* — Park, Vaughan, Fleming & Dowler LLP

(57) ABSTRACT

The disclosed embodiments relate to a system that performs low-temperature desalination. During operation, the system feeds cold saline water through a liquid-cooling system in a computer data center, wherein the cold saline water is used as a coolant, thereby causing the cold saline water to become heated saline water. Next, the system feeds the heated saline water into a vacuum evaporator comprising a water column having a headspace, which is under a negative pressure due to gravity pulling on the heated saline water in the water column. This negative pressure facilitates evaporation of the heated saline water to form water vapor. Finally, the system directs the water vapor through a condenser, which condenses the water vapor to produce desalinated water.

10 Claims, 4 Drawing Sheets

USING WASTE HEAT FROM A DATA CENTER COOLING SYSTEM TO FACILITATE LOW-TEMPERATURE DESALINATION

RELATED APPLICATION

This application is a divisional application of, and hereby claims priority under 35 U.S.C. § 120 to, pending U.S. patent application Ser. No. 15/884,851, entitled "Using Waste Heat from a Data Center Cooling System to Facilitate Low-Temperature Desalination," by inventors Kenny C. Gross and Sanjeev Sondur, filed on 31 Jan. 2018, which is hereby incorporated by reference.

BACKGROUND

Field

The disclosed embodiments generally relate to techniques for desalinating seawater. More specifically, the disclosed embodiments relate to a new technique that uses waste heat from a computer data center cooling system to drive a low-temperature desalination process for seawater.

Related Art

The United Nations recently reported that 40% of the world's population lives in regions affected by scarcity of safe water supplies. Note that 97% of the water on Earth is salt water, and much of the remaining 3% is not easily accessible because it is in the atmosphere or frozen in the polar ice caps. With predictions that more than 3.5 billion people will live in areas facing severe water shortages by the year 2025, a major challenge is to find an environmentally benign way to remove salt from seawater.

At the same time, computer data centers are consuming more than 500 terawatts of electricity worldwide. In fact, the U.S. Department of Energy reports that in 2016 data centers consumed 2% of the electricity generated in the United States, and at present, approximately 40% of this energy is used for cooling purposes.

However, air cooling of data centers has nearly reached the limits allowed by the laws of physics. As heat densities continue to climb in data centers, the power consumed by cooling fans in modern servers has become so great that in many cases the fan motors are consuming more energy than the CPU chips in the servers. Fluid is substantially more efficient for heat removal than air, so thermal experts are predicting that the data centers of the future will be fluid-cooled. Note that modern data centers typically use hybrid fluid-air cooling systems, which still use fans inside servers, but then extract the heat from the exhaust air using a large, efficient water-cooled heat-exchanger system.

Hence, it would be advantageous to develop a technique, which uses the large amount of waste heat generated by fluid cooling systems in computer data centers to drive the process of desalinating seawater.

SUMMARY

The disclosed embodiments relate to a system that performs low-temperature desalination. During operation, the system feeds cold saline water through a liquid-cooling system in a computer data center, wherein the cold saline water is used as a coolant, thereby causing the cold saline water to become heated saline water. Next, the system feeds the heated saline water into a vacuum evaporator comprising a water column having a headspace, which is under a negative pressure due to gravity pulling on the heated saline water in the water column. This negative pressure facilitates evaporation of the heated saline water to form water vapor. Finally, the system directs the water vapor through a condenser, which condenses the water vapor to produce desalinated water.

In some embodiments, the system feeds the cold saline water through the condenser prior to feeding the cold saline water into the liquid cooling-system, wherein the condenser uses the cold saline water to condense the water vapor.

In some embodiments, after the cold saline water feeds through the condenser, the system feeds the cold saline water through an inlet heat exchanger, which uses unevaporated heated saline water obtained from the vacuum evaporator to preheat the cold saline water prior to feeding the cold saline water into the vacuum evaporator.

In some embodiments, a control unit in the system receives telemetry data from the data center through a telemetry harness. This control unit uses the received telemetry data to optimize the desalination efficiency of the vacuum evaporator and the computational performance of the computer data center by scheduling jobs having different priorities in the computer data center to control variations in an aggregate thermal load of the computer data center. This indirectly controls variations in a temperature of the heated saline water, which affects the desalination efficiency of the vacuum evaporator.

In some embodiments, while scheduling the different priority jobs, the control unit makes a tradeoff between the desalination efficiency and computational performance for the different priority jobs.

In some embodiments, the control unit enables a user to adjust the tradeoff between the desalination efficiency and the computational performance.

In some embodiments, while optimizing the desalination efficiency and the computational performance, the control unit additionally controls a flow rate through the liquid-cooling system in the computer data center.

In some embodiments, while optimizing the desalination efficiency and the computational performance, the control unit uses a multiple-input, multiple-output (MIMO) control strategy based on a multivariate state estimation technique (MSET) to optimize the tradeoff between the desalination efficiency and the computational performance.

In some embodiments, the desalination efficiency is optimized by minimizing peaks and valleys in an aggregate computational load for the different priority jobs in the computer data center.

In some embodiments, the telemetry data includes one or more of the following measured values for processors in the computer data center: power consumption parameters; temperatures; and processor performance parameters.

DETAILED DESCRIPTION

Figure 1:
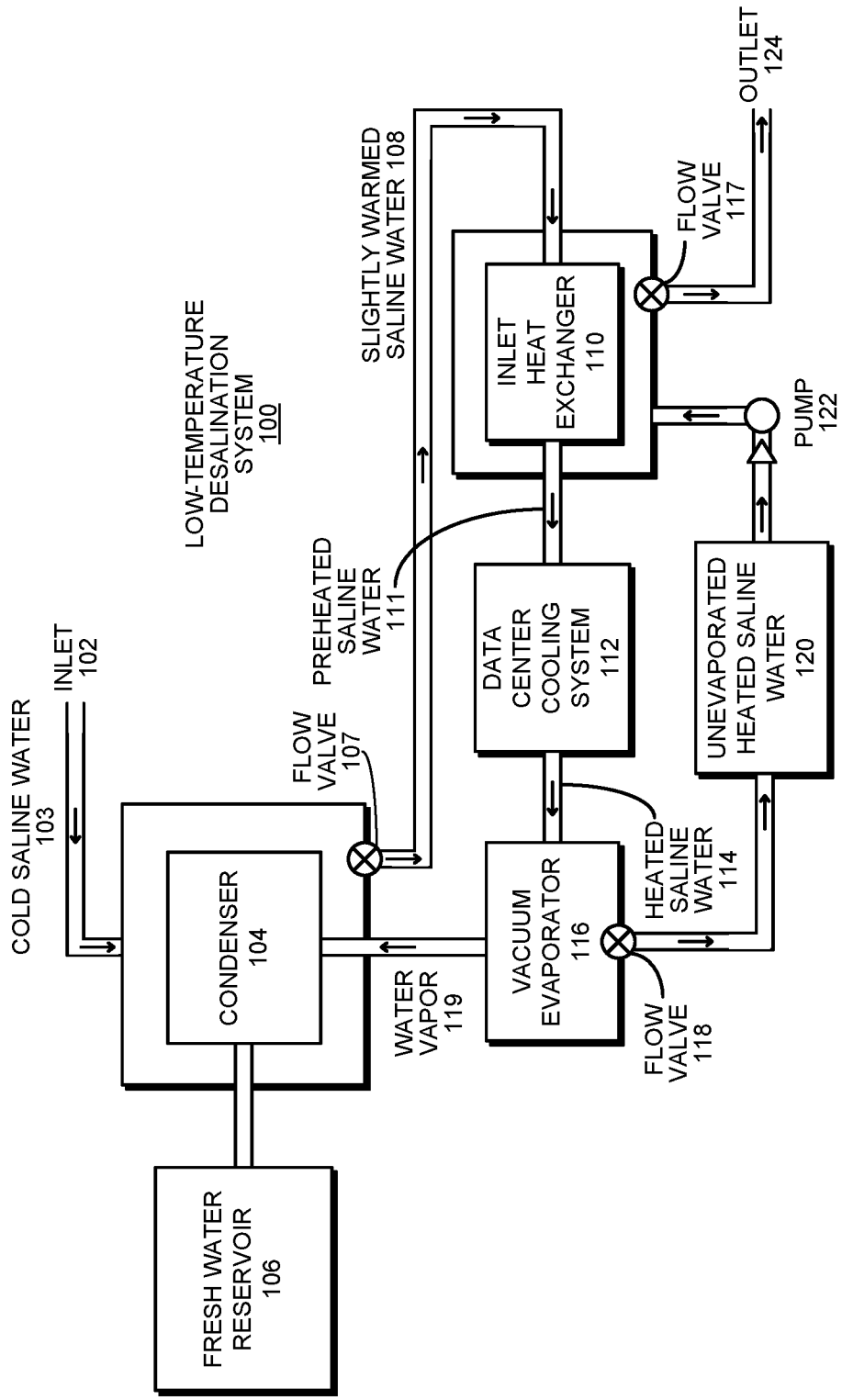
FIG. 1 illustrates an exemplary low-temperature desalination system in accordance with the disclosed embodiments.

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Overview

The disclosed embodiments provide a telemetry-controlled system that allows the waste heat from the computer servers to be recycled efficiently to help solve a growing global shortage of drinkable water. This system integrates intelligent power monitoring (IPM) telemetry with both power-aware job scheduling and intelligent control of cooling fluid to facilitate a new low-temperature, low-pressure desalination process, which converts salt water into drinking water with zero added carbon cost. For fluid-cooled data centers, which are located near an ocean, and for modular data centers, which can always be deployed near an ocean, this new integrated system exploits low-cost cooling using cold seawater and also leverages the "free" waste heat generated by computer servers by using an optimal control scheme that produces drinking and irrigation water as a byproduct.

This system integrates three elements into a novel system that provides efficient cooling for data centers while turning seawater into drinking water. The three elements include: (1) an IPM telemetry system; (2) a continuous system telemetry harness (CSTH); and (3) a low-temperature desalination system.

The IPM telemetry system performs real-time monitoring for all of the temperatures, voltages, currents, power metrics, and fan speeds inside the computer servers in a data center. In doing so, the IPM telemetry system facilitates real-time assessment of the dynamic power levels of both servers and storage technology throughout the data center, even in the absence of a network of distributed hardware power meters.

The CSTH provides a software application that enables power-aware job scheduling for data center jobs to produce a relatively flat aggregate thermal load for the data center when it is desirable to optimize the efficiency of the desalination process. A novel machine-learning control technique (described below) allows an end customer to "turn a knob" to either achieve maximum computational throughput with some reduction in desalination efficiency, or achieve maximum desalination efficiency with some reduction in completion times for low- and medium-priority workloads. (Note that high-priority jobs always complete as soon as possible under either "efficiency preference" setting.)

This low-temperature desalination system operates differently from a conventional thermal desalination system, which uses a coal-fired plant (or nuclear plant) to boil seawater, and then condenses the resulting vapor. This conventional approach has disadvantages because coal can cause a significant amount of pollution, and nuclear plants cost many billions of dollars and involve safety-critical systems, which rely on high-pressure steam containment.

Fortunately, a new low-temperature, low-pressure desalination process has recently been developed. This new approach is quite simple. If a pipe is filled with water, and then sealed on one end, and then the open end is left underwater and the sealed end is put up in the air, the water column "hangs" under its own weight and creates a vacuum at the top (the sealed end). The higher the sealed end, the greater the vacuum.

Note that seawater vaporizes quite easily and at relatively low temperatures when under vacuum. Hence, the heat source only needs to be 40-50° C. to provide good desalination efficiency. Also note that because the vacuum is gravity driven, this new technique requires no complex mechanical vacuum generators. The entire system operates passively; it just needs a good source of free waste heat. For details about how such a low-temperature desalination system operates, please see U.S. Pat. No. 8,080,138, entitled "Desalination Using Low-Grade Thermal Energy," by inventors Nagamany Nirmalakhandan, et al., filed on 12 Dec. 2007, issued 20 Dec. 2011, which is hereby incorporated by reference.

Computer data centers provide such a source of waste heat. Data centers presently produce gigawatts of waste heat, which is presently being dumped into the atmosphere. (Note that one data center uses the same amount of electricity as a city of 100,000 people.) Moreover, there presently exist tens of thousands of data centers around the world, many of which are located in coastal cities with unlimited volumes of salt water within easy pumping distance. The fluid-air heat exchangers that are already being built into such data centers can be used to sufficiently concentrate the waste heat from the data centers to facilitate efficient large-scale conversion of seawater into potable drinking water, through a low-temperature desalination process, which only requires the seawater to be heated to a temperature of about 40-50° C.

This energy-aware scheduling technique operates by optimally sequencing high-, medium-, and low-priority jobs to run on computational assets, in a manner that does not violate service level agreements for workload completion, and also optimizes the efficiency of turning salt water into clean drinking water by intelligently capturing the "free" waste heat from computer server systems, which is presently ejected into the atmosphere. Note that this new low-temperature desalination technique avoids the complexity and danger of conventional high-pressure desalination systems, wherein seawater must be boiled and condensed, and also the enormous energy costs associated with the heat sources for conventional boiling-based desalination.

Having a uniform flow of warm water is a key to maintaining good desalination efficiency. Hence, the integrated system uses intelligent workload scheduling coupled with telemetry-driven flow rate control to control the exit temperature of the cooling water from the data center. Moreover, the integrated system allows the end user to "turn a knob" to optimize overall data center operations to facilitate maximum computing throughput performance, or to facilitate maximum drinking-water purification.

As a further efficiency enhancement, the system can direct the cold seawater through the condenser first, which warms the seawater slightly before it is used to cool the hot thermal exhaust air from the racks of computing equipment. Note that warming the seawater slightly in the condenser makes the seawater somewhat less efficient for server cooling. However, this efficiency loss is more than offset by the efficiency gain during the desalination process.

For maximum desalination efficiency, it is desirable to get as much heat into the water as we can, so we warm it up first in the condenser, and then preheat it in an inlet heat exchanger before it is heated up in the hot-air exhaust of the computer data center.

For maximum computational performance, we turn up the flow rate for the water, which causes the computers to stay cooler, which enables the computers to maximize computational performance. However, the water does not get as warm at higher flow rates, so desalination efficiency drops. The new integrated system allows a user to adjust this tradeoff by "turning a knob" to optimize between more clean water output or higher compute performance. (Note that a by-product of this process will be truckloads of sea salt, which has a much higher profit margin than regular table salt.)

As mentioned above, causing the computers to stay cooler facilities maximizing computational performance. Note that all enterprise computing central-processing units (CPUs), including those from Intel, AMD, Oracle, and IBM, presently use real-time dynamic-voltage-and-frequency scaling (DVFS) to adjust the frequency and voltage of the CPUs to avoid wasteful "leakage power" in the CPUs. Leakage power is exponentially driven by CPU temperatures, so that DVFS "slows down" the operating frequency of CPUs when the CPU temperatures are warmer, and "speeds up" the operating frequency when the CPU temperatures are cooler. Consequently, there is an increase in computational performance and throughput when the CPUs are cooler, and a performance penalty when the CPUs are warmer, for all modern enterprise computing systems. (See "Leakage-Aware Workload and Cooling Management for Improving Server Energy Efficiency," M. Zapater, O. Tuncer, J. L. Ayala, J. M. Moya, K. Vaidyanathan, K. C. Gross, and A. K. Coskun, *Transactions on Parallel and Distributed Systems Journal*, Jun. 29, 2014.) Because of this relationship between CPU temperatures (which are measured by the CSTH for every CPU and every core in all of the computer systems being cooled by salt water and used as separate inputs to the MIMO controller) and CPU performance, the MIMO controller allows the end user to select a balance point between maximum desalination efficiency and maximum CPU performance.

FIG. 1 illustrates an exemplary low-temperature desalination system 100 in accordance with the disclosed embodiments. During operation, low-temperature desalination system 100 receives cold saline water 103 from inlet 102. This cold saline water 103 first feeds through a condenser 104, wherein it is used to cool water vapor 119 produced by vacuum evaporator 116. The cooled water vapor condenses to form fresh water, which is collected in fresh water reservoir 106. The condenser 104 also causes the cold saline water 103 to be converted into slightly warmed saline water 108, which feeds into an inlet heat exchanger 110. Inlet heat exchanger 110 uses unevaporated heated saline water 120 received from vacuum evaporator 116 to preheat the slightly warmed saline water 108 to form preheated saline water 111, which then feeds into a data center cooling system 112. The unevaporated heated saline water 120 then exits the system through outlet 124. Data center cooling system 112 further heats the preheated saline water 111 to produce heated saline water 114, which feeds into vacuum evaporator 116. As mentioned above, vacuum evaporator 116 uses the heated saline water to produce water vapor 119, which feeds into condenser 104, which condenses the water vapor 119 to form fresh water, which is stored in fresh water reservoir 106.

As mentioned above, the operation of low-temperature desalination system 100 is controlled by a pump 122, and also by a number of flow valves 107, 117 and 118.

This type of low-temperature desalination system can be implemented in a standard "modular data center" (MDC) unit. Existing MDC units already have a high-efficiency fluid-cooling system with two large fire-hose connections, one for cold water going in, and one for hot water going out. Essentially all of the waste heat generated inside the MDC is removed via the cooling water, minus a very small amount of heat that escapes from the six insulated sides of the MDC. Although the low-temperature desalination system is described in the context of an MDC unit, this type of system has no scalability limitations, and can therefore be used in any larger or smaller data center with a liquid-cooling system.

Figure 3:
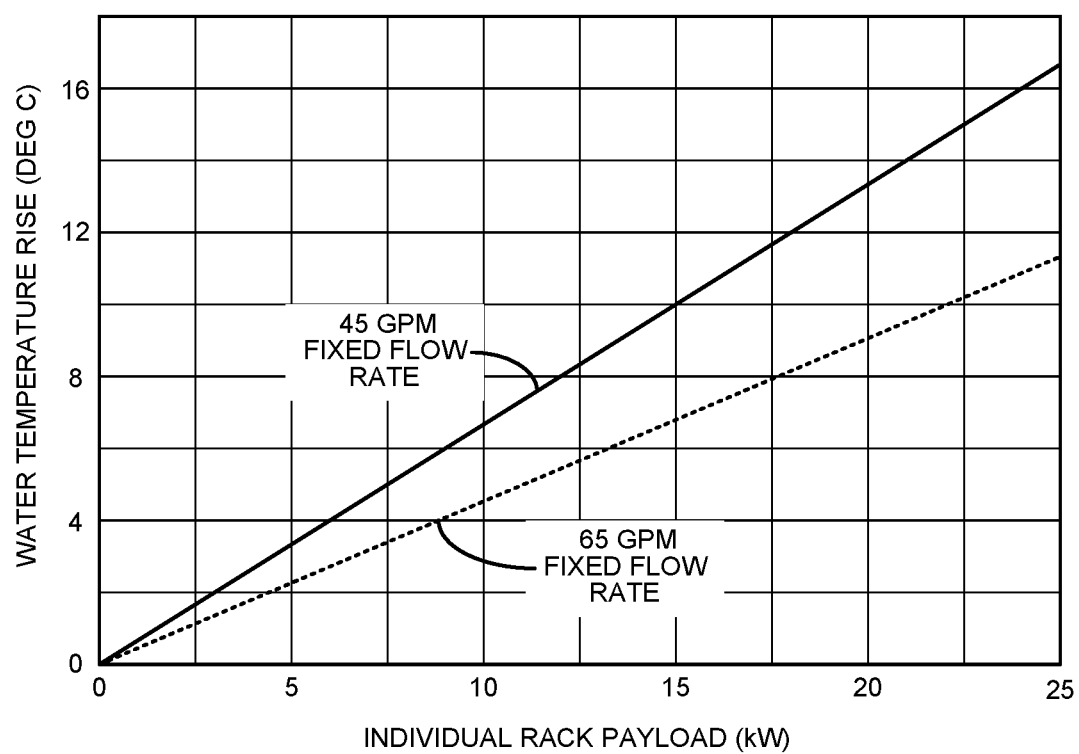
FIG. 3 maps the increase in water temperature at two exemplary fixed flow rates in relation to individual rack payload in kilowatts in accordance with the disclosed embodiments.

The disclosed embodiments combine real-time telemetry of the cooling-water inlet temperature with machine-learning-based control of the cooling system flow rate (based on MSET) to control the exit temperature of the cooling water from the data center. Note that, in any conventional system with a fluid-cooled heat exchanger, if the flow rate of the cooling fluid is increased, then the system gets cooler, and the exit temperature of the cooling fluid is cooler. Conversely, if the flow rate of the cooling fluid is slowed down, the system does not get cooled as much, and the exit temperature of the slower-moving cooling fluid is higher. For example, FIG. 3 maps the increase in water temperature at two exemplary fixed flow rates (45 GPM and 65 GPM) in relation to individual rack payloads in kilowatts in accordance with the disclosed embodiments. Note that, in order to optimize the efficiency of the desalination process, it is preferable to have a uniform heat flux inside the data center, so that the cooling-water exit temperature can be kept near the "sweet spot" for desalination efficiency.

Figure 2:
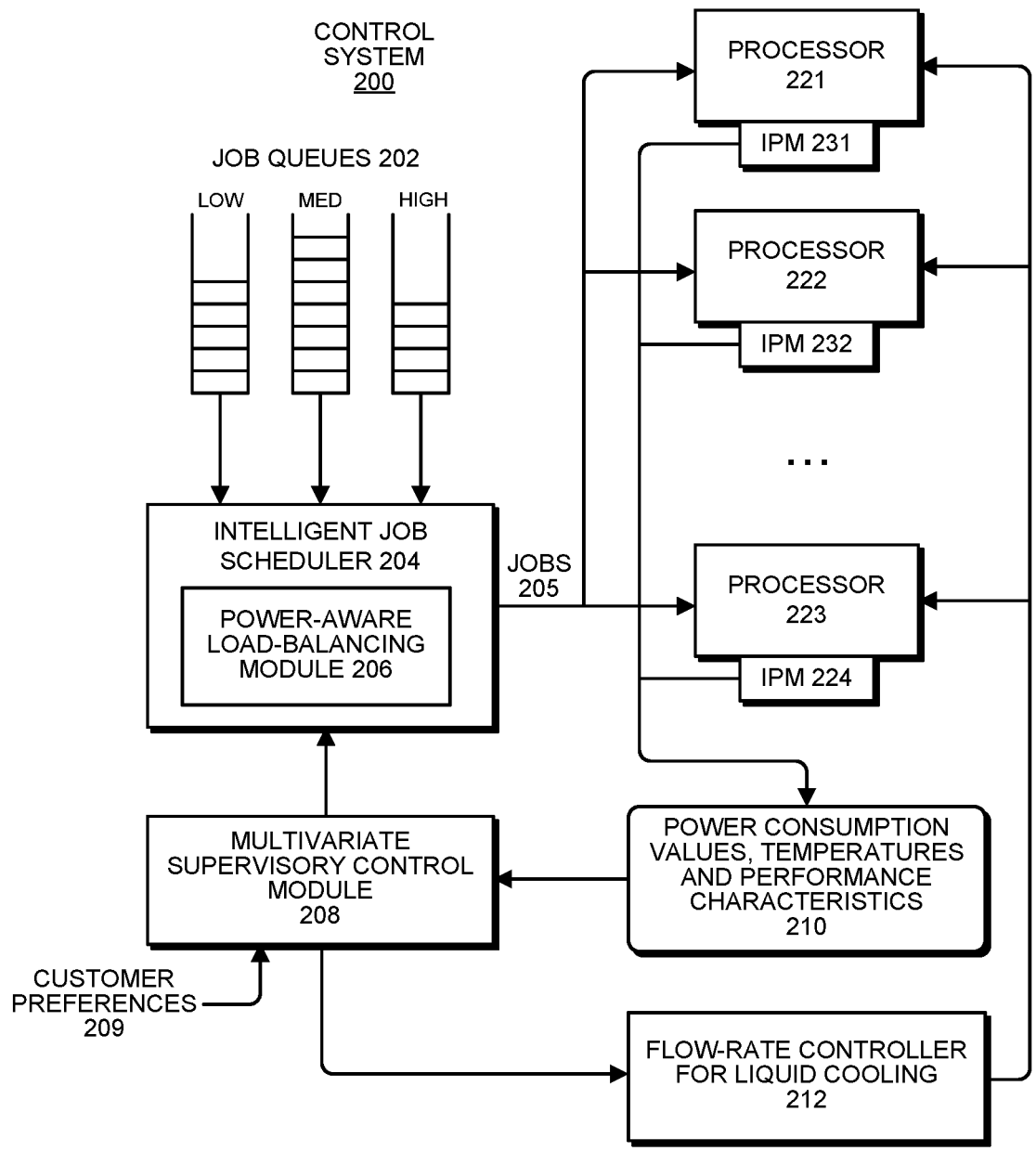
FIG. 2 illustrates a control system that balances desalination efficiency with computational throughput in accordance with the disclosed embodiments.

However, many data center workloads are quite dynamic over time. To remedy this problem, we can smooth out these dynamics using a control system 200, which implements a power-aware intelligent job scheduler as is illustrated in FIG. 2. This job scheduler exploits user-defined priority flags and divides the compute jobs into three priority categories: low, medium, and high. The system, however, can generally use any continuum of priorities.

The low-, medium- and high-priority jobs are stored in corresponding job queues 202. Low-priority jobs typically include long-running simulations, batch numerical analysis workloads, background database builds, operating housecleaning utilities, and other types of long-lived jobs. Medium-priority jobs typically include jobs for which a human eventually wants to access and manually interact with the results, but does not expect those results to be produced in seconds or minutes. High-priority jobs are typically business-critical applications, or involve direct human-interactive processes, such as searching, spreadsheet manipulation, database mining, etc. These high-priority jobs are always dispatched as soon as possible when the computing assets become available. Note that if all jobs were treated as high-priority, there would be significant dynamics in the overall workload with corresponding peaks and troughs in energy flux, which would cause fluctuations in the cooling water exit temperature if the flow rate is constant.

The dispatching of jobs 205 is controlled by an intelligent job scheduler 204, which includes a power-aware load-balancing module 206. Note that jobs 205 are dispatched to various processors 221-223 in the data center. Moreover, processors 221-223 include corresponding intelligent power monitors (IPMs) 231-233, which communicate various parameter values, such as power consumption values, temperatures and performance characteristics 210 for processors 221-223 to a multivariate supervisory control module 208.

Multivariate supervisory control module 208 then uses these parameter values along with customer preferences 209 to control both intelligent job scheduler 204 and flow-rate controller for liquid cooling 212, which controls pump 122 and flow valves 107, 117 and 118 within low-temperature desalination system 100. In doing so, multivariate supervisory control module 208 uses a novel multiple-input, multiple-output (MIMO) control scheme that uses the multivariate state estimation technique (MSET) to simultaneously and optimally control cooling-fluid flow rate and energy-aware load scheduling. (For additional details about MIMO control schemes, please see U.S. Pat. No. 5,920,478, entitled "Multiple-Input, Multiple-Output Generic Interacting Controller," by inventor Mark K. Ekblad, et al., filed on Jun. 27, 1997, which is hereby incorporated by reference. For additional details about MSET, please see Gross, K. C., R. M. Singer, S. W. Wegerich, J. P. Herzog, R. Van Alstine, and F. K. Bockhorst, "Application of a Model-based Fault Detection System to Nuclear Plant Signals," Proc. 9th Intl. Conf. on Intelligent Systems Applications to Power Systems, Seoul, Korea, 1997.)

One aspect of the disclosed embodiments is that the real-time power flux (monitored via the IPM) from the computing system components is input into the intelligent job scheduler 204, which inserts small delays in the dispatching of the medium-priority jobs, and larger delays in the dispatching of the low-priority jobs. In this way, the intelligent job scheduler 204 uses the low-priority and medium-priority jobs to "fill in" troughs in overall thermal flux for a much more balanced and stable aggregate workload and, hence, a more stable thermal flux. (For additional details about intelligent job scheduling, please see U.S. Pat. No. 8,555,283, entitled "Temperature-Aware and Energy-Aware Scheduling in a Computer System," by inventors Ayse K. Coskun, Kenny C. Gross and Keith A. Whisnant, filed on Nov. 12, 2007, which is hereby incorporated by reference.)

To the extent there are still overall variations in aggregate thermal flux for the data center (e.g., if there are sustained periods with low utilization such as in the middle of the night or on the weekend), the system can control the cooling water flow to maintain the desired uniform output coolant temperature for the integrated low-pressure desalination system.

Desalination Process

Figure 4:
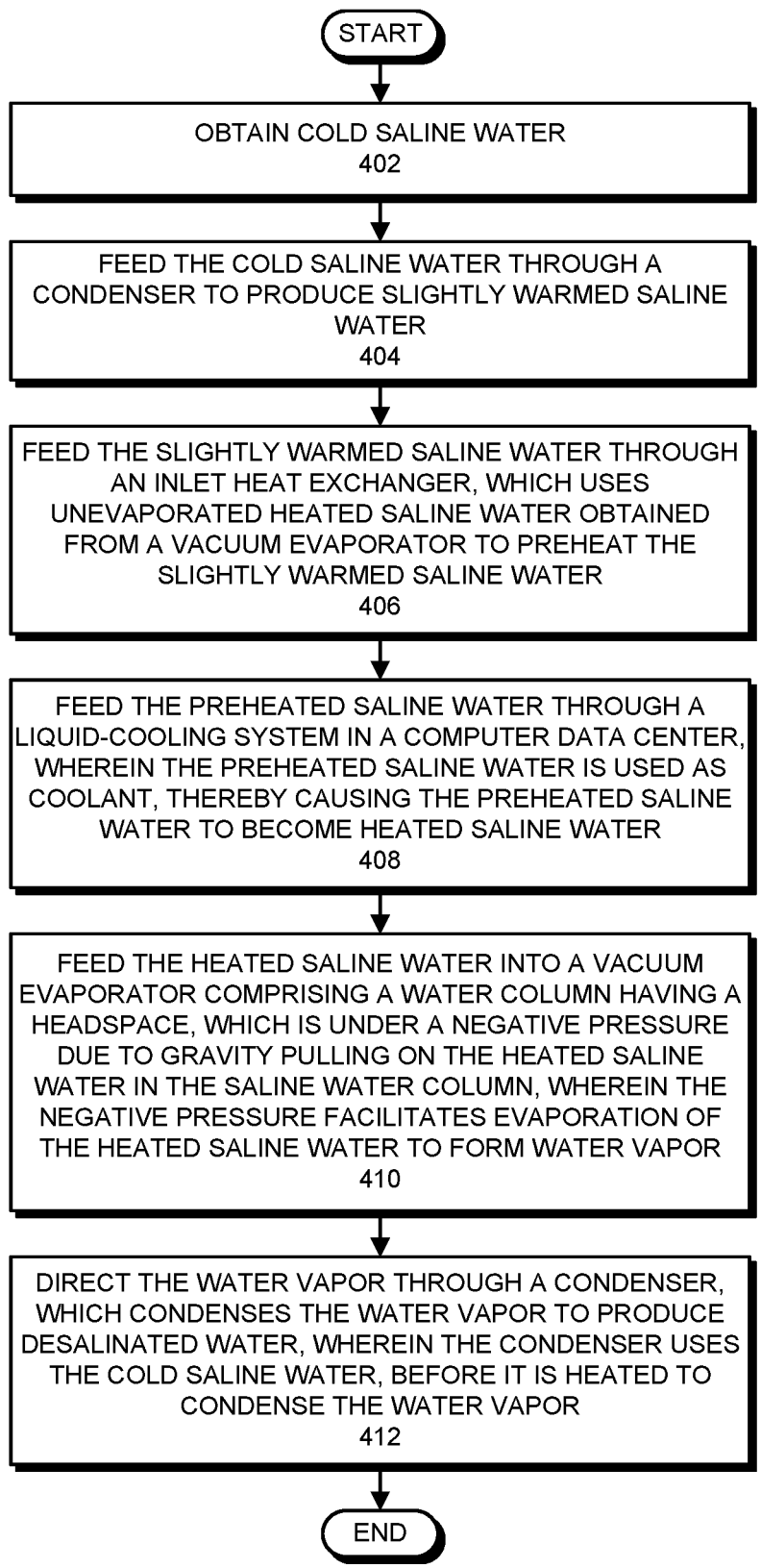
FIG. 4 presents a flow chart illustrating the process of operating the low-temperature desalination system in accordance with the disclosed embodiments.

FIG. 4 presents a flow chart illustrating the process of operating the low-temperature desalination system in accordance with the disclosed embodiments. During operation, the system first obtains cold saline water (step 402). Next, the system feeds the cold saline water through a condenser to produce slightly warmed saline water (step 404). The system then feeds the slightly warmed saline water through an inlet heat exchanger, which uses unevaporated heated saline water obtained from a vacuum evaporator to preheat the slightly warmed saline water (step 406). Next, the system feeds the preheated saline water through a liquid-cooling system in a computer data center, wherein the preheated saline water is used as a coolant, thereby causing the preheated saline water to become heated saline water (step 408). The system then feeds the heated saline water into a vacuum evaporator comprising a water column having a headspace, which is under a negative pressure due to gravity pulling on the heated saline water in the water column, wherein the negative pressure facilitates evaporation of the heated saline water to form water vapor (step 410). Finally, the system directs the water vapor through the condenser, which condenses the water vapor to produce desalinated water, wherein the condenser uses the cold saline water to condense the water vapor (step 412).

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for performing low-temperature desalination, comprising:
   obtaining cold saline water, wherein the cold saline water is ocean water;
   feeding the cold saline water through a liquid-cooling system in a computer data center, wherein the cold saline water is used as a coolant, thereby causing the cold saline water to become heated saline water;
   feeding the heated saline water into a vacuum evaporator comprising a water column having a headspace, which is under a negative pressure due to gravity pulling on the heated saline water in the water column, wherein the negative pressure facilitates evaporation of the heated saline water to form water vapor;

directing the water vapor through a condenser, which condenses the water vapor to produce desalinated water;

receiving telemetry data from the data center through a telemetry harness; and using the received telemetry data to optimize a desalination efficiency of the vacuum evaporator and a computational performance of the computer data center by scheduling jobs having different priorities in the computer data center to control variations in an aggregate thermal load of the computer data center, thereby indirectly controlling variations in a temperature of the heated saline water, which affects the desalination efficiency of the vacuum evaporator, wherein scheduling the different priority jobs involves making a tradeoff between the desalination efficiency and computational performance for the different priority jobs.

2. The method of claim 1, wherein the method further comprises feeding the cold saline water through the condenser prior to feeding the cold saline water into the liquid-cooling system, wherein the condenser uses the cold saline water to condense the water vapor.

3. The method of claim 2, wherein after the cold saline water feeds through the condenser and becomes warmed saline water, the method further comprises feeding the warmed saline water through an inlet heat exchanger, which uses unevaporated heated saline water obtained from the vacuum evaporator to preheat the warmed saline water prior to feeding the preheated saline water into the liquid-cooling system.

4. The method of claim 1, wherein the method further comprises enabling a user to adjust the tradeoff between the desalination efficiency and the computational performance.

5. The method of claim 1, wherein optimizing the desalination efficiency and the computational performance additionally involves controlling a flow rate through the liquid-cooling system in the computer data center.

6. The method of claim 1, wherein optimizing the desalination efficiency and the computational performance additionally involves using a multiple-input, multiple-output (MIMO) control strategy based on a multivariate state estimation technique (MSET) to optimize the tradeoff between the desalination efficiency and the computational performance.

7. The method of claim 1, wherein the desalination efficiency is optimized by minimizing peaks and valleys in an aggregate computational load for the different priority jobs in the computer data center.

8. The method of claim 1, wherein the telemetry data includes one or more of the following measured values for processors in the computer data center:

power consumption parameters;

temperatures; and processor performance parameters.

9. The method of claim 1, further comprising:

increasing a flow rate of the cold saline water, thereby increasing the computational performance of one or more computers in the computer data center.

10. The method of claim 1, further comprising:

removing sea salt resulting from evaporation of the warm saline water in the vacuum evaporator.

* * * * *

UNITED STATES PATENT AND TRADEMARK OFFICE
CERTIFICATE OF CORRECTION

PATENT NO. : 10,934,178 B2
APPLICATION NO. : 16/787453
DATED : March 2, 2021
INVENTOR(S) : Gross et al.

Page 1 of 1

It is certified that error appears in the above-identified patent and that said Letters Patent is hereby corrected as shown below:

On the Title Page

Column 1, under Assignee, Line 1, delete "Corporation" and insert -- Corporation, Redwood Shores, CA (US) --, therefor.

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*